United States Patent [19]

Malin et al.

[11] Patent Number: 5,133,635
[45] Date of Patent: Jul. 28, 1992

[54] METHOD AND APPARATUS FOR HOLDING AND CONVEYING PLATELIKE SUBSTRATES

[75] Inventors: Cosmas Malin, Mauren; Harry Sawatzki, Vaduz, both of Liechtenstein

[73] Assignee: Tet Techno Investment Trust Settlement, Vaduz, Liechtenstein

[21] Appl. No.: 526,284

[22] Filed: May 21, 1990

[30] Foreign Application Priority Data

Mar. 5, 1990 [CH] Switzerland ............... 00686/90-1

[51] Int. Cl.⁵ .................................. B25J 15/00
[52] U.S. Cl. .................... 414/744.8; 294/104; 414/416; 414/225; 414/786
[58] Field of Search ............ 414/744.1, 225, 751, 414/753, 416, 935, 937, 941, 786; 294/103.1, 104, 34, 907; 901/36, 39

[56] References Cited

U.S. PATENT DOCUMENTS

| | | | |
|---|---|---|---|
| 4,410,209 | 10/1983 | Trapani | 294/34 |
| 4,639,028 | 1/1987 | Olson | 294/103.1 X |
| 4,775,281 | 10/1988 | Prentakis | 414/416 |
| 4,808,059 | 2/1989 | Eddy | 414/416 |
| 4,900,214 | 2/1990 | Ben | 294/103.1 X |

FOREIGN PATENT DOCUMENTS

| | | |
|---|---|---|
| 3402664 | 10/1984 | Fed. Rep. of Germany . |
| 3917260 | 12/1989 | Fed. Rep. of Germany . |
| 57-20444 | 2/1982 | Japan ............ 414/935 |

*Primary Examiner*—Robert J. Spar
*Assistant Examiner*—Donald W. Underwood

[57] ABSTRACT

A method of handling and securing platelike substrates, such as wafers, is described in which a substrate is gripped between supporting elements situated opposite each other in the plane of the substrate to be applied against opposite side edges of the substrate. The gripping forces are applied through resilient means in order to limit the gripping force applied. Apparatus for gripping a substrate in accordance with this method has the supporting element or elements on one side in a fixed position and the other movable towards the substrate to apply the gripping force, the resilient means being disposed between said other element or elements and the driving means for said movement. There is also described an optical sensing system for positioning the supporting element relative to a substrate.

14 Claims, 4 Drawing Sheets

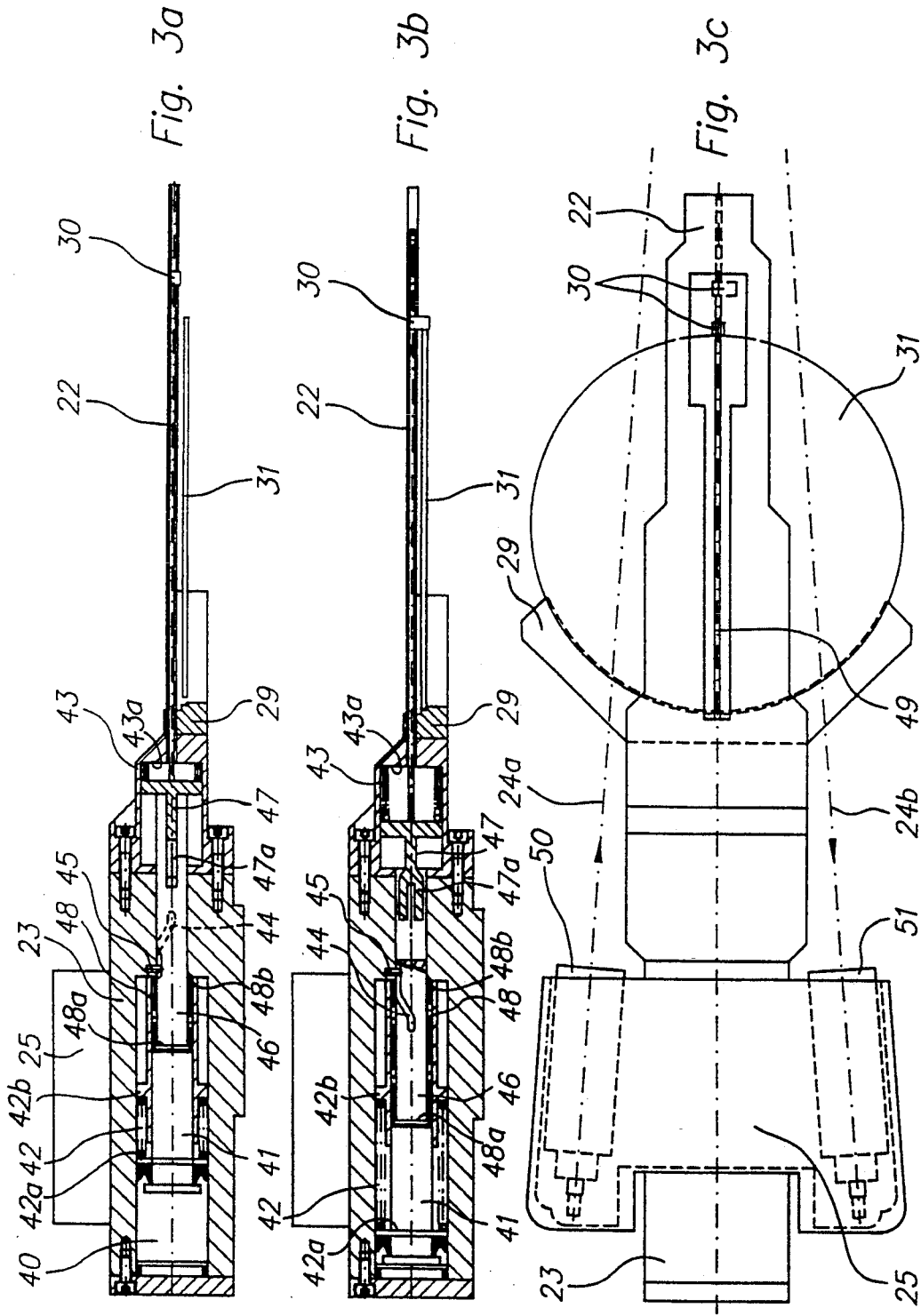

METHOD AND APPARATUS FOR HOLDING AND CONVEYING PLATELIKE SUBSTRATES

BACKGROUND OF THE INVENTION

The invention relates to a method and an apparatus for holding and/or conveying platelike substrates, particularly wafers, by means of handling systems in inspection and production machines, particularly in wafer inspection devices, wherein a movable arm of the handling system comprises a gripper to which a wafer to be conveyed can be secured through supporting elements on the gripper, and means are provided for securing to the gripper.

In addition, the invention relates to a method and an apparatus for the contactless recognition of platelike substrates to be held and/or to be conveyed, particularly wafers.

When processing and/or inspection is to be carried out, such a substrate or wafer generally has to be removed from storage in a so-called wafer cassette, be temporarily placed on a support of a processing and/or inspection table and, after appropriate processing and/or inspection, be finally stored in a further wafer cassette.

During the processing and/or inspection operation, the wafers to be processed and/or inspected are in a special atmosphere so as to be able to prevent any kind of contamination, and furthermore, during the conveying, the position once taken up in the conveying system must be prevented from changing in an uncontrolled manner.

New submicrometre technologies not only require the fronts of substrates and wafers to be absolutely free of contamination but also the backs to be free of particles.

For example, even contamination of the backs of wafers can lead to defocussing of a micro-lithographic exposure. Thus it is a standard requirement on many substrates, such as glass substrates for masks for example, that they must be absolutely free of contamination on both sides.

In addition, secure and reliable automatic grasping of the substrate or of the wafer by the corresponding gripper is an essential requirement of a wafer processing and/or inspection device working at high speed.

A first example of such a gripper arrangement is known from German Patent Publication 3917260. In this a gripper is provided with a pick-up device which contains a vacuum device, in which case the wafers to be inspected are drawn against the pick-up device over a portion of the platelike surface via suction holes and can thus be conveyed. With such an arrangement, the wafer is attracted by suction applied at least partially to one of its most sensitive surfaces and so contamination cannot be prevented there. In addition, the wafers or substrates that require to be handled are extremely thin discs and are not of a material which is very resistant to bending; as a result of the unilateral loading which occurs, for example, during swivelling movements with the wafer thus gripped, occasional breakage during handling has to be accepted in consequence. This is an unacceptable disadvantage in such vacuum systems.

Another disadvantage which cannot be ignored in the case of substrates held under vacuum is the fact that in the event of failure of the vacuum, the substrate falls down from the gripping location and is liable to be damaged, as is also the case if, with substrates held by suction at one side, a drop in the vacuum force occurs accidentally or as a result of the article slipping sideways—that is to say it loses its position—on swivelling movements of the gripper.

An alternative gripper arrangement is known from German Patent Publication 3402664, using two flexibly guided supporting elements but this is unsatisfactory if only because of the nature of the movements to be executed. The use of belt drives as proposed in this case, leads to such a great risk of contamination and instability as well as fluctuations during movements, that system vibrations would be a direct consequence.

Furthermore, in this arrangement a further disadvantage arises with regard to the detection of a wafer to be gripped. Detection is only assured to the extent that the coordinate system at the beginning of the inspection or processing can be kept stable since it is customary to operate robotically from such a coordinate system. Even if precautions are taken to mount the inspection device isolated from vibrations and oscillation, the accuracy and reliability which can be achieved in this manner cannot be regarded as adequate.

Instead, care must be taken to ensure that, with such handling systems, before a wafer to be conveyed or processed is grasped, the movement can be carried out each time in a controlled manner, after renewed adjustment, particularly in view of the fact that, in the storage state, the wafers are generally in standard cassettes which only provide very little spacing between two adjacent wafers.

Not least, the system should be able to detect whether a wafer is or is not present for inspection. For contactless detection of objects over relatively great distances, optical systems inter alia have gained acceptance for the purpose, particularly in two kinds, namely (i) transmitter and receiver of a light source are arranged so that the object to be detected comes to lie between transmitter and receiver, or (ii) the light from the transmitter reflected or scattered by the object is detected by a receiver.

Systems of the first kind generally work very reliably but have the disadvantage that transmitter and receiver have to be spatially separated from one another constructionally which thus makes a compact form of structure impossible. Systems of the second kind are more unreliable because the condition and geometry of the surface exert a great influence. On the other hand, they permit movement of the transmitter, which is often an advantage.

SUMMARY OF THE INVENTION

It is an object of the present invention to provide a method and an apparatus for holding and/or conveying platelike substrates, particulary wafers, whereby the substrate can be temporarily kept on the smallest space, grasped and conveyed, in a reliable and careful manner.

In a method according to the invention the substrate or wafer to be conveyed is gripped resiliently between at least two supporting elements of gripper means, the one element being in a fixed position and the second being movable tangentially to the margin of the wafer to be conveyed, and a transmitter and receiver of an optical detection device are disposed on the gripper means, the beam emitted by the transmitter being focused so that the focus point of the emitted beam comes to lie on the margin or edge of a substrate to be detected.

The focus point of the emitted beam may be aligned on the lateral edge of the wafer to be detected, which can contribute to an extremely precise automatic control of the operation of the gripper means.

The invention is based on the concept of grasping the wafer to be held and transported exclusively at its outer margin and thereby avoiding any contamination of the high-quality wafer surface. In addition, as a result of gripping the wafer resiliently, it is possible to prevent stresses being produced by excessively hard mechanical loading of the outer edge which might lead to fracture of a wafer slice. As a result of the combined arrangement of transmitter and receiver of the optical detection device on one and the same component, namely the gripper means, a space-saving arrangement is presented.

The optical detection device that may be used in the performance of the present invention combines the advantages of the two methods referred to previously since the reliability of the first of these methods, with the necessary interruption of the beam of light, may be obtained, and as a result of the accommodation of transmitter and receiver on one and the same component in the form of the gripper means, movement during the detection operation likewise does not play any part.

In a preferred feature of the invention, a reflecting surface is arranged between transmitter and receiver of the optical detection device so that the reflected beam of light is reflected directly through a diaphragm into a receiver. If an object—for example a lateral edge of a wafer, is then introduced into the focus point of the beam of light, the beam of light is interrupted. Since the diameter in the focus point can be very small, the change in the light arriving at the receiver can be very large even with very small or thin objects and even with very short travel distances. Thus, because of this small focus point, the lateral edge of the wafer slice can be detected very accurately.

With the insignificant mobility of the optical detection device, the fact that the reflecting surface has a large dimension corresponding to the area of movement naturally plays a decisive part.

Two embodiments of the invention are described in more detail below with reference to the drawings.

BRIEF DESCRIPTION OF THE DRAWINGS

FIGS. 3a and 3b show in vertical section a gripper means of a first apparatus according to the invention, the gripper means being in non-operative open state in FIG. 3a and in an operative gripping state in FIG. 3b;

FIG. 3c is a plan view of the gripper means in FIG. 3b, with the gripped wafer;

DESCRIPTION OF THE PREFERRED EMBODIMENTS

Figure 1:
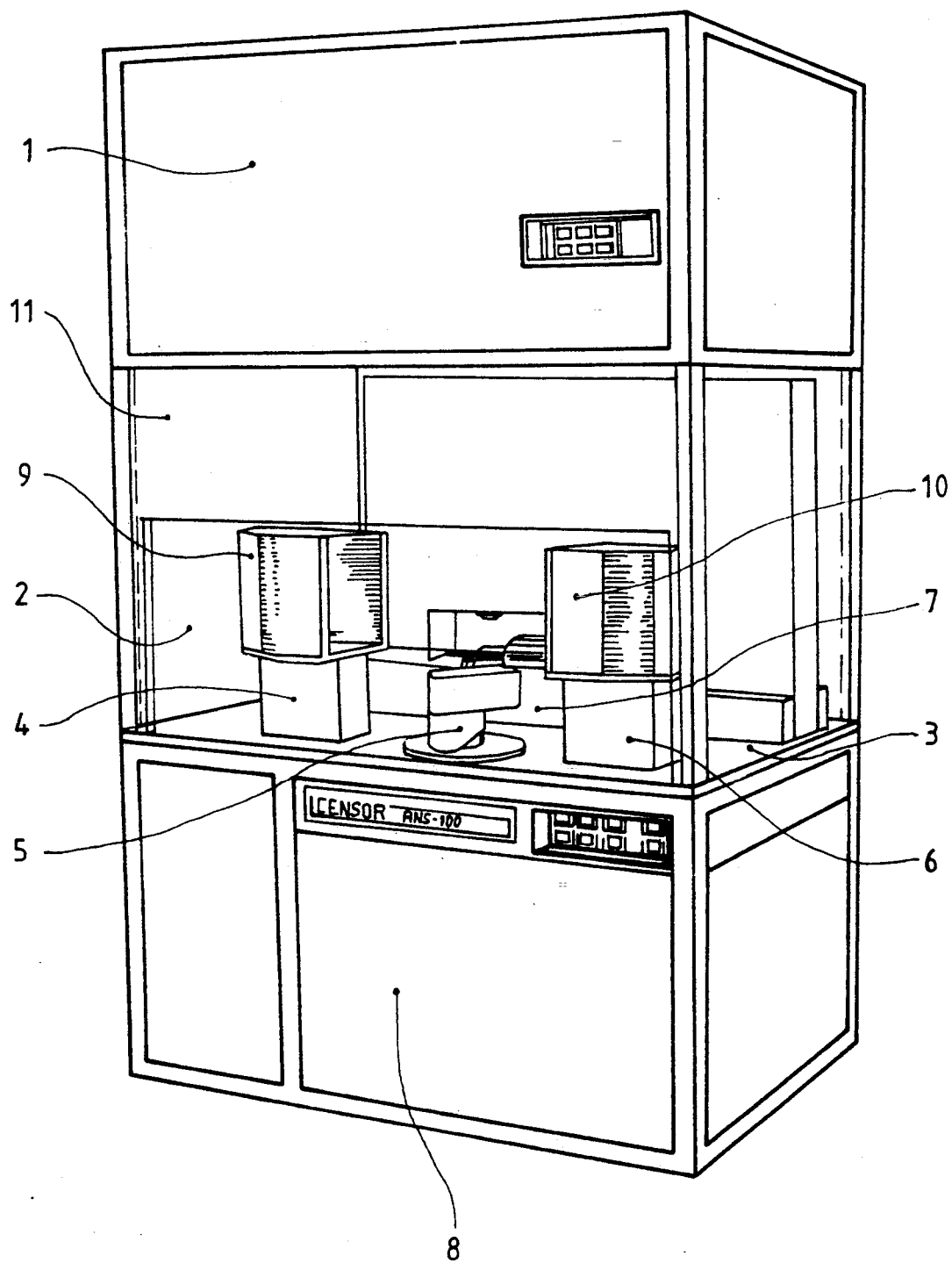
FIG. 1 shows a general view of the wafer inspection device.

FIG. 1 shows a substrate surface inspection device such as is used primarily for the inspection of wafers. Apart from the smallest particles, crystal defects, metallic impurities, polishing faults, scratches, implant in-homogeneities and other effects on wafers can be made visible with such devices.

The device comprises a flow-box 1 which ensures the necessary purity of the atmosphere in the measuring chamber 2. The measuring chamber 2 is in its turn encased in antistatic transparent plastics sheets 11. As a result, the desired laminar flow is achieved by a chimney effect.

The handling system is secured to a transparent table top 3. In addition, this inspection device has a first substrate-cassette receiver 4, a robot 5 and a second substrate-cassette receiver 6. The inspection operation is carried out on the plane table 7.

The handling system is mounted on a frame 8 which is likewise flow-transparent.

A typical measuring cycle goes as follows:

A substrate or wafer is removed from a first substrate cassette 9, which is on the substrate-cassette receiver 4, by means of a robot 5, and is conveyed to the plane table 7 where the actual inspection operation is carried out.

After the measurement, the robot 5 removes the substrate and puts it in the second cassette 10 provided on the second substrate-cassette receiver 6. It is of particular importance in the course of this that the substrate is not at a great distance above the table top 3 either during the transfer or while at rest for the purpose of inspection.

Figure 2A:
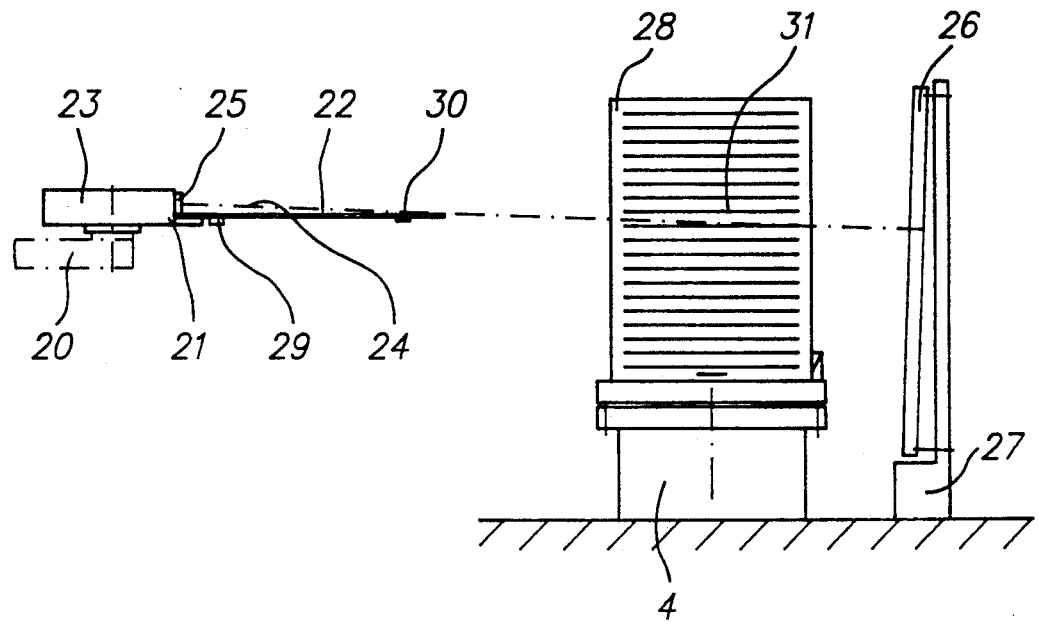
FIG. 2a shows a detail from FIG. 1 with the handling system in a preparatory position.

FIG. 2a shows a more detailed illustration of the wafer transport device. On an arm 20 of the robot 5, the gripper means 21—a device comprising gripper element 22 and gripper drive 23 for the element—is illustrated in a state of rest, that is to say in a preparatory or non-operative position. A laser beam 24 of a substrate detection system 25 mounted on the gripper means is directed onto a mirror 26 which is adjustable via a mirror holding means 27. The mirror 26 is adjusted so that the laser beam 24 is reflected back into the substrate detection system 25.

The first wafer cassette 28 is between substrate detection system 25 and mirror 26. The laser beam 24 can pass uninterrupted through the wafer cassette 28 itself, from the substrate detection system 25 to the mirror 26 and back again. If a wafer 31 is present in the wafer cassette 28, however, the laser beam 24 no longer gets back to the substrate detection system. Under these conditions, a clamping pin 30 of the gripper element 22 is swung up and the gripper element is thus in a position to penetrate into the wafer cassette between two adjacent wafers until it is situated precisely over the surface of a wafer.

Figure 2B:
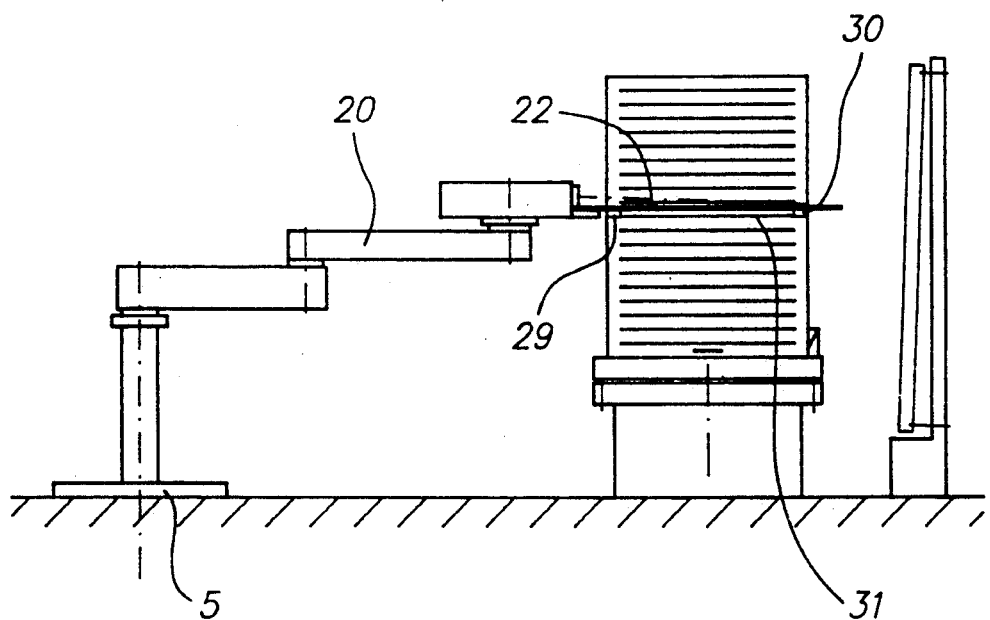
FIG. 2b shows a detail from FIG. 1 with the handling system in the working position.

FIG. 2b shows the robot arm 20 of the robot 5 in the extended state, in the working position, during the grasping of a wafer 31 from the wafer cassette 28 filled with wafers. The wafer 31 is gripped between the clamping pin 30, swung into the gripping position and thereby acting as a supporting element for the wafer, and a further supporting element 29. The wafer 31 is then held in this position by the spring loading of a wafer spring 43 of the gripper drive 23.

In removing the wafer 31 from the cassette, the robot 5 lifts the wafer slightly before the robot ar 20 is withdrawn.

FIG. 3a shows the side view of a first detailed example of a gripper means in the open or non-gripping state. In this state a positive pressure in a pressure chamber 40 has displaced a cylindrical piston 41 and a grooved piston 46 towards the gripper element 22, against the spring force of three springs 42, 43 and 48. Spring 42 bears with one end against a flange 42a fixed on the cylindrical-piston 41 and with the other end against a flange 48b fixed in the gripper drive 23. Spring 48 bears with one end against a flange 48a fixed on the grooved piston 46, and with the other end against a flange 48b fixed in the gripper drive 23. The wafer clamping spring 43 bears one end against a driver 47 and with the other end against a shoulder 43a of the gripper drive 23. The cylindrical piston 41 and the grooved piston 46 are movable independently of one another. During longitudinal movement of the grooved piston it is given a rotational movement by the engagement in a groove 44 in the piston of a pin 45 in a fixed position in the body of the gripper drive. In the course of this movement, the grooved piston 46 transmits this longitudinal and rotational motion to a driver 47 which is movable both with and independently of the grooved piston 46. The driver 47 is rigidly connected to a push-and-pull rod 49 and the clamping pin 30 so as to rotate the pin 30 between a nontransverse, withdrawn position substantially within the gripper element 22 of the gripping means as shown in FIG. 3a and an extended position profecting transversely of the gripper element as shown in FIG. 3b as the rod moves backwards and forwards with the stroke of the grooved piston. For this purpose the rod 49 is mounted in a guide permitting both axial and rotational movement. The end 47a of the driver 47 for the rod 49 may be in the form of a fork-shaped construction as shown in FIG. 3b to engage the slotted end of the piston 46 for longitudinal translation with and relative to the piston and rotation with the piston.

FIG. 3b shows the gripping means in the loaded state. In this case, the pressure in the pressure chamber 40 has been released so that the spring 42 urges the cylindrical piston into a position of rest. The grooved piston 46 is driven back by the spring 48 and in the course of this is rotated by the groove and pin connection 44,45. The connection between grooved piston 46 and driver 47 is such that the driver 47 only follows the longitudinal movement of the grooved piston 46 to the extent that this is permitted by the wafer 31 gripped by the clamping pin 30 and the push-and-pull rod 49 against supporting element 29. The driver 47 then lifts off the grooved piston 46 and the wafer clamping spring 43, through the push-and-pull rod 49, presses the clamping pin 30 against the wafer 31 and thus presses the wafer 31 against the supporting element 29.

FIG. 3c shows a plan view of the gripping means. The position of the clamped wafer 31 and the positions assumed by the clamping pin 30—in both the clamped and unclamped states—can be seen in particular. A laser (transmitting) light source 50 and a corresponding receiver 51 are also indicated on the gripper body. In this case, the beam 24 emitted from the light source 50 is directed over an outward path 24a to the mirror 26 and reflected over a return path 24b.

Figures 4A, 4B:
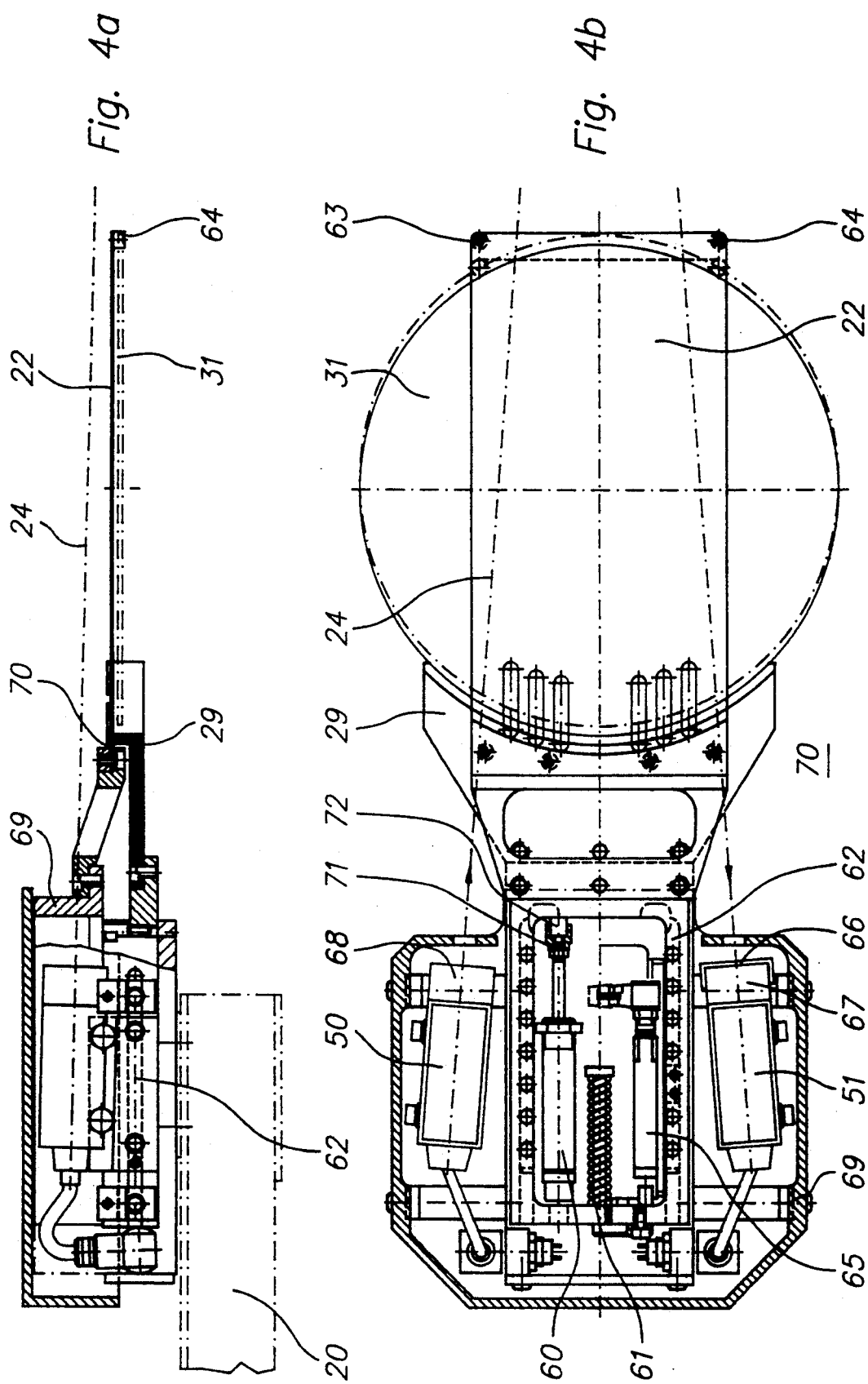
FIGS. 4a and 4b show a gripper means of a second apparatus according to the invention, FIG. 4a being a vertical section and FIG. 4b being a partly sectioned plan view also showing the gripped wafer.

FIG. 4a shows a side view of a second example of gripper means in which a pneumatic cylinder 60 displaces a carriage 69 mounted on a linear guide 62. The connection between pneumatic-cylinder actuating rod 71 and the carriage 69 is loosely coupled through a damping element 72. The carriage 69 is pressed against the pneumatic-cylinder actuating rod 71 by means of a spring 61. The movable gripper element 22 is rigidly coupled to the carriage 69. In the opened state, there is a positive pressure in the pneumatic cylinder 60 which thus moves clamping pins 63 and 64 secured to the element 22 away from the supporting element 29. When the pressure drops in the pneumatic cylinder 60, the carriage 69 together with the element 22 and the clamping pins 63 and 64 is moved by the spring 61 in the direction X towards the supporting element 29 until the wafer 31 rests on clamping pins 70 of the supporting element 29.

In the plan view of FIG. 4b there is shown a switch 65 which responds to the position of the carriage 69 in relation to the robot arm 20. The laser light source 50 comprises an optical system 68 which focuses the beam of light 24 on the position of the wafer 31 to be detected in the retracted state of the robot arm 20. A receiver 51 comprises an optical system 67 with lenses and filters (not illustrated) in front of which there is a diaphragm 66. These components increase the reliability and accuracy of the substrate detection system.

In the examples described, the supporting elements may have notched engagement surfaces for engaging the wafer more securely. The engagement surfaces may be lined with a softer, e.g. plastics, material to protect the wafer.

We claim:

1. A method of holding platelike substrates in handling machines, said method employing a handling system comprising a movable arm and gripper means on said arm having an elongate gripper element and at least two supporting elements for gripping said substrate, one of said supporting elements being movable from a nontransverse, withdrawn position substantially within the elongate gripper element to an extended position projecting in a direction generally transverse to the gripper element, the method comprising the steps of bringing the gripping means adjacent a selected substrate with the one of the supporting elements in the nontransverse, withdrawn position, moving the one of the supporting elements from the nontransverse, withdrawn position to the extended position, positioning said two supporting elements in the plane of the substrate and adjacent opposite side edge regions of the substrate, holding at least a first of said supporting elements at one of said side edge regions of the substrate in a fixed location and displacing at least one other of said supporting elements at the side edge region opposite to said one region towards said first element to apply said at least one other element against the substrate and put said supporting elements in gripping engagement with said opposite side edge regions of the substrate, the gripping engagement being applied through resiliently yielding means to thereby limit the gripping force applied to the substrate.

2. A method according to claim 1 wherein the position of the substrate relative to the gripping means is determined without contact by an optical detection device focusing a beam of light on the substrate.

3. A method according to claim 2 wherein said beam of light is focused onto a lateral edge of the substrate.

4. Apparatus for use in holding and conveying platelike substrates in substrate processing and inspection machines, said apparatus comprising a movable arm, gripper means on said arm, said gripper means having supporting elements in spaced positions on the gripper means for location on opposite sides of a substrate to grip the substrate through opposite side edge regions thereof, an elongate gripper element having one of said supporting elements mounted upon the gripper element for movement between a nontransverse, withdrawn position substantially within the elongated gripper element and an extended position projecting transversely from the elongated gripper element and adjacent a side edge of the substrate, means for moving the one of the supporting elements between the nontransverse, withdrawn and extended positions; means linked to said one of the supporting elements for axial displacement of said one of the supporting elements relative to said elongate gripper element in the extended position to move said one of the supporting elements relative to at least one other of said supporting elements on the opposite side of the substrate for gripping said opposite side edge regions of the substrate between the supporting elements, resilient means acting between the axial displacement means and the supporting means on at least one side of the substrate for limiting the gripping force applied to the substrate.

5. Apparatus according to claim 4 wherein the supporting elements have notch-form substrate engagement surfaces, a plastics lining being provided on said surfaces.

6. Apparatus according to claim 4 further comprising an optical detection device for detecting the position of the substrate relative to the gripping means, said device comprising a transmitter for emitting a beam and a receiver for receiving said beam reflected from a reflecting surface, said transmitter and receiver being both fixed relative to the movable arm.

7. Apparatus according to claim 6 wherein the transmitter comprises a laser source.

8. Apparatus according to claim 4 wherein an elongated connecting member having one of the supporting elements mounted thereon for movement with the supporting element between the nontransverse, withdrawn and extended positions is mounted in the elongate gripper element in generally parallel relationship with the gripper element and; guide means for the elongated connecting member hold the member rotatably about an axis extending parallel to the longitudinal extend thereof, and the means for moving the one of the supporting elements between positions comprises means for rotating said member about said axis, said one supporting element mounted upon the member projecting transversely to the longitudinal axis of said member and being rotatable with said member from the nontransverse, withdrawn position in which it projects in a direction essentially parallel to the substrate, to the extended position in which it projects in a direction substantially perpendicular to said substrate.

9. Apparatus according to claim 8 wherein the means linked to said one of the supporting elements includes piston-and-cylinder drive means connected for said axial displacement of said connecting member, and the means for rotating includes a slotted guide connection between a piston and cylinder of said drive means whereby said axial displacement of the connecting member also rotates said member in step with its displacement.

10. Apparatus according to claim 9 wherein the resilient means comprises a clamping spring providing a resilient link through which a gripping force is applied to the supporting elements to secure the substrate to the gripping means, and wherein another piston-and-cylinder arrangement is in communication with the one piston-and-cylinder arrangement and both arrangements are displaced against the force of said spring for releasing the substrate from the gripping means.

11. Apparatus according to claim 10, wherein both said piston and cylinder arrangements are combined in a single unit.

12. Apparatus according to claim 8 wherein the elongated connecting member has an end portion of fork-shaped construction for rotationally guiding said end portion.

13. Apparatus for use in holding platelike substrates in substrate handling means, said apparatus comprising a movable arm, gripper means on said arm to which a substrate to be held or conveyed is to be secured, supporting elements on the gripper means for gripping the substrate and securing it to the gripper means, said supporting elements being disposed in spaced relationship to be positioned on opposite sides of the substrate, one of the supporting elements being movable on the gripper means from a position out of the plane of the substrate to a position projecting into the plane of the substrate, displacement means acting on the supporting elements for moving the one of the supporting elements into the plane of the substrate and both of the supporting elements into engagement with the side edge regions of the substrate for gripping the substrate, the supporting elements on each side of the substrate providing multiple contacts for opposite side edge regions of the substrate for gripping and securing of the substrates.

14. Apparatus for holding platelike substrates in a substrate handling machine, comprising a movable arm, gripper means on said arm, supporting elements on the gripper means for engagement with a planar substrate to be held or conveyed by said arm, one of the supporting elements being movable relative to the gripper means between a withdrawn position substantially within the gripper means and out of the plane of the substrate and an extended position in the plane of the substrate, means for positioning said supporting elements including the one of the supporting elements in the extended position in the plane of the substrate and on opposite sides of the substrate, and resilient means acting on the supporting element on at least one side of the substrate for moving said element towards the substrate to grip the substrate resiliently between said oppositely positioned elements.

* * * * *